United States Patent [19]

Pohl

[11] 4,168,173

[45] Sep. 18, 1979

[54] POLYMERS FOR INCREASING THE VISCOSITY OF PHOTOSENSITIVE RESINS

[75] Inventor: Rudolph L. Pohl, Chester County, Pa.

[73] Assignee: Hercules Incorporated, Wilmington, Del.

[21] Appl. No.: 940,226

[22] Filed: Sep. 7, 1978

Related U.S. Application Data

[63] Continuation-in-part of Ser. No. 801,266, May 27, 1977, abandoned.

[51] Int. Cl.² .................... G03C 1/68; C08G 18/00
[52] U.S. Cl. ........................... 96/115 P; 96/115 R; 204/159.19
[58] Field of Search ................. 96/115 P, 115 R; 204/159.19

[56] References Cited

U.S. PATENT DOCUMENTS

| | | | |
|---|---|---|---|
| 3,556,791 | 1/1971 | Suzuki et al. | 96/35 |
| 3,628,963 | 12/1971 | Akamatsu et al. | 96/115 R |
| 3,644,120 | 2/1972 | Kai et al. | 96/115 R |
| 3,652,272 | 3/1972 | Thomas | 96/115 R |
| 3,661,576 | 5/1972 | Grary | 96/115 R |
| 3,861,921 | 1/1975 | Hoffman et al. | 96/86 P |

*Primary Examiner*—Jack P. Brammer
*Attorney, Agent, or Firm*—Marion C. Staves

[57] ABSTRACT

It has been found that high quality relief printing plates can be made using a photosensitive composition comprising at least one unsaturated polyester, at least one ethylenically unsaturated, addition polymerizable monomer, at least one photosensitive initiator and a poly(hydroxylether) derived from a diphenol and an epihalohydrin, such as bisphenol A-epichlorohydrin resin. The poly(hydroxylether) increases the viscosity of the photosensitive resin such that the resin is less likely to flow during platemaking process, thereby avoiding undesirable blemishes on the finished plate.

5 Claims, No Drawings

POLYMERS FOR INCREASING THE VISCOSITY OF PHOTOSENSITIVE RESINS

This application is a continuation-in-part of copending application Ser. No. 801,266, filed May 27, 1977, now abandoned.

BACKGROUND OF THE INVENTION

The use of liquid photopolymerizable resins for making relief printing plates is well known (see U.S. Pat. No. 3,556,791 to Suzuki et al.). Basically, the platemaking process involves spreading a uniform layer of liquid photopolymerizable resin on a substrate and exposing selected portions of the liquid resin layer to actinic radiation, whereby the exposed areas are hardened while the unexposed areas remain liquid. The plate is then subjected to a washing process which removes the unexposed, still liquid portions from the relief plate's surface.

An important variable in making high quality photopolymer relief printing plates is the viscosity of the resin. Low resin viscosity results in undesirable flow of the liquid photopolymer resin during the platemaking process. This resin flow can cause split lines and abnormal shoulders on half-tone dots in the finished plate. Also, to produce relief plates of consistent quality, it is important that the viscosity of the liquid photopolymerizable resin be uniform from batch to batch.

Increasing the resin viscosity decreases the incidence of flow-related printing defects. Several methods have been used to increase the viscosity of liquid photopolymerizable resins. Using a higher molecular weight, higher viscosity photopolymer is one obvious method. However, the higher molecular weight prepolymer is closer to its gel point than a lower viscosity prepolymer. Thus, close control during the prepolymer preparation is necessary or the entire reaction mixture may gel. Also, it is difficult to prepare a high viscosity prepolymer with good batch to batch uniformity.

Another way in which the resin viscosity can be controlled is by changing the resin formulation. By increasing the prepolymer concentration and/or decreasing the concentration of monomers which have an especially low viscosity, the overall viscosity of the resin can be increased. However, unless the desired viscosity increase is small (e.g., a few thousand cps.), large changes in the physical properties of the cured resin can result.

SUMMARY OF THE INVENTION

This invention relates to a method for increasing the viscosity of liquid unsaturated polyester photosensitive resin formulations. More particularly, this invention relates to the addition of a phenoxy resin to the liquid unsaturated polyester resin formulation to increase resin viscosity. This increase in the resin viscosity allows relief plate manufacture without the flow-related printing defects found in plates made from low viscosity resins.

DETAILED DESCRIPTION OF THE INVENTION

Basically, most photosensitive compositions contain three components—(1) a binder of some type, generally a polymer or resin (referred to herein as the prepolymer), (2) a hardening and insolubilizing material, generally a cross-linking agent or polymerizable monomer, and (3) a photosensitive initiator.

Typical of the binders are the unsaturated polyesters prepared according to known methods from at least one unsaturated polycarboxylic acid, a saturated polycarboxylic acid and at least one polyol. Examples of unsaturated polycarboxylic acids and anhydrides which can be used in the preparation of unsaturated polyesters are maleic acid, fumaric acid, citraconic acid, mesaconic acid, itaconic acid, glutaconic acid, muconic acid, aconitic acid and their anhydrides, in particular, maleic anhydride, citraconic anhydride and itaconic anhydride. Adipic acid is normally used as the saturated polycarboxylic acid. Examples of polyols which can be used in the preparation of unsaturated polyesters are ethylene glycol, 1,2-propylene glycol, propane-1,3, butanediol-1,4, diethylene glycol, dipropylene glycol, polyethylene glycol, polypropylene glycol, polybutylene glycol, etc.

Typical hardening materials are the ethylenically unsaturated addition polymerization monomers such as acrylic acid, methacrylic acid, methyl acrylate, ethyl acrylate, n-propyl acrylate, isopropyl acrylate, n-hexyl acrylate, n-octyl acrylate, cyclohexyl acrylate, allyl acrylate, glycidyl acrylate, styrene, vinyl toluene, divinyl benzene, carboxystyrene, diallyl phthalate, triallyl cyanurate, vinyl acetate, acrylamide, methacrylamide, N-methylol acrylamide, N-methylol methacrylamide, N-methoxymethyl acrylamide, N-ethoxymethyl acrylamide, N-ethoxymethyl methacrylamide, N-n-butoxy methyl acrylamide, N,N'-methylene bis acrylamide, N,N'-methylene bis methacrylamide, N,N'-trimethylene bis acrylamide, N,N'-hexamethylene bis acrylamide, 2-hydroxyethyl acrylate, 2-hydroxyethyl methacrylate, 2-hydroxypropyl acrylate, 3-chloro-2-hydroxypropyl acrylate, 4-hydroxybutyl acrylate, diethylene glycol monoacrylate, dipropylene glycol monoacrylate, polyethylene glycol monoacrylate, ethylene glycol diacrylate, tetraethylene glycol diacrylate, propylene glycol dimethacrylate, diethylene glycol dimethacrylate, tetraethylene glycol dimethacrylate, trimethylolpropane triacrylate, N-3-oxo-propyl acrylamide, N-3-oxobutyl acrylamide, N-3-oxo-1-methylbutyl acrylamide, N-3-oxo-1-dibutyl-2-n-propylheptyl acrylamide, etc.

The specific photosensitive initiator used will depend upon the other components as well as the light source employed. Typical photosensitive initiators are the benzoins, such as benzoin, benzoin methyl ether, benzoin ethyl ether, benzoin isobutyl ether, benzoin isopropyl ether, alpha-methylbenzoin, alpha-ethylbenzoin, alpha-phenylbenzoin, alpha-allylbenzoin, etc.; the anthraquinones, such as anthraquinone, chloroanthraquinone, methylanthraquinone, ethylanthraquinone, etc.; the diketones, such as benzil, diacetyl, etc.; the 2,2-dialkoxy substituted acetophenones, such as 2,2-diethoxy acetophenone, etc.; the 2,2-dialkoxy-2-phenyl substituted acetophenones, such as 2,2-dimethoxy-2-phenylacetophenone, etc.; the disulfides, such as diphenyldisulfide, tetraethylthiuramdisulfide, etc.; 2-naphthalene-sulfonyl chloride, etc.

Those skilled in the art will realize that the number of basic components can be more than three, such as where a mixture of two or more materials is used for one of the above components. In addition to the basic components, the photosensitive composition may also contain thermal stabilizers, fillers, plasticizers, etc., as is well known in the art.

The photosensitive unsaturated polyester resin compositions described above are liquid in their uncured state. As such, they are susceptible to undesirable flow during the plate-making process. This tendency to flow is directly related to resin viscosity, i.e., the lower the resin viscosity the more likelihood of resin flow.

It has now been discovered that the viscosity of these unsaturated polyester resins can be significantly increased by the addition of a phenoxy resin to the photosensitive resin formulation. In particular, the phenoxy resin is an amorphous, linear, high molecular weight poly(hydroxyether) derived from diphenols and an epihalohydrin. Preferably, the phenoxy resin is a bisphenol A-epichlorohydrin resin. As stated above, the phenoxy resin should have a high molecular weight, on the order of 8,000 to 200,000. Preferably, the phenoxy resin's molecular weight will be in the range of about 10,000 to about 100,000.

The phenoxy resin may be added in concentrations ranging from about 0.1% to about 15%, preferably about 2% to about 5% based on total weight.

The phenoxy resin may be added to the photosensitive resin formulation by dissolving it in the monomer component prior to the addition of the monomer to the unsaturated polyester binder. While the phenoxy resin can be added to the unsaturated polyester prepolymer component, considerably more time is required for the phenoxy resin to dissolve than when added to the monomer component.

The thus prepared photosensitive resin formulation can be used to produce relief printing plates using standard platemaking techniques. The phenoxy resin, being inert, does not interfere with the photochemistry of the photosensitive resin, nor does it affect the removal of uncured resin during the washing process. Also, the addition of the phenoxy resin to the photosensitive resin formulation does not affect the clarity of the photosensitive resin. Further, the physical properties of the cured photosensitive resin remain unchanged.

EXAMPLE 1

A photosensitive composition is prepared by thoroughly blending, at room temperature, 100 parts of an unsaturated polyester prepolymer, and 61.3 parts of a solution containing polymerizable monomers, a photoinitiator and thermal polymerization inhibitors. The unsaturated polyester prepolymer used in this composition is prepared by reacting 0.5 mole of fumaric acid, 0.25 mole of adipic acid, 0.25 mole of itaconic acid, 0.50 mole of diethylene glycol and 0.50 mole of propylene glycol at 190°–200° C. for 12 hours under an atmosphere of nitrogen gas. The unsaturated polyester prepolymer has an acid number of 29 and a Brookfield viscosity of 1560 cps. at 100° C. and 272,000 cps. at 25° C. The monomer solution is prepared by mixing the following ingredients and stirring until the solid ingredients dissolve:

|  | % By Weight |
| --- | --- |
| Diethylene glycol dimethacrylate | 55.2 |
| 2-Hydroxyethyl methacrylate | 26.4 |
| Diacetone acrylamide | 13.3 |
| Benzoin ethyl ether | 4.7 |
| Butylated hydroxy toluene | 0.26 |
| 4-Methoxyphenol | 0.14 |

After thoroughly blending the unsaturated polyester prepolymer and the monomer solution, the clear photosensitive resin formulation's Brookfield viscosity is 5640 cps. at 25° C.

EXAMPLES 2–4

The following examples illustrate the increase in viscosity of the photosensitive resin formulation described in Example 1 upon addition of bisphenol A-epichlorohydrin resin (Bakelite Phenoxy Resin PKHH made by Union Carbide Corporation, molecular weight approximately 30,000).

| Example | Phenoxy Resin (parts per hundred) | Brookfield Viscosity (cps. at 25° C.) |
| --- | --- | --- |
| 2 | 1.24 | 8,960 |
| 3 | 2.48 | 13,840 |
| 4 | 4.96 | 21,280 |

EXAMPLE 5

A photosensitive composition is prepared by blending, at room temperature, 77 parts of an unsaturated polyester prepolymer with 23 parts of a solution containing polymerizable monomers, a photoinitiator and thermal polymerization inhibitors. The unsaturated polyester prepolymer used in this composition is prepared by reacting 0.20 mole of fumaric acid, 0.30 mole of isophthalic acid, 0.50 mole of adipic acid, 0.25 mole of propylene glycol and 0.75 mole of diethylene glycol at 190°–200° C. for 12 hours under an atmosphere of nitrogen gas. The unsaturated polyester prepolymer has an acid number of 28 and a Brookfield viscosity of 1700 cps. at 100° C. The monomer solution is prepared by mixing the following ingredients and stirring until the solid ingredients dissolved:

|  | Parts by Weight |
| --- | --- |
| 2-Hydroxyethyl methacrylate | 15 |
| Diacetone acrylamide | 30 |
| Tetraethylene glycol dimethacrylate | 55 |
| Benzoin isobutyl ether | 1.80 |
| Butylated hydroxy toluene | 0.10 |
| 4-Methoxyphenol | 0.05 |

After thoroughly blending the unsaturated polyester prepolymer and the monomer solution, the clear photosensitive resin formulation's Brookfield viscosity is 6200 cps. at 25° C.

EXAMPLES 6–8

The following examples illustrate the increase in viscosity of the photosensitive resin formulation described in Example 5 upon addition of bisphenol A-epichlorohydrin resin (Bakelite Phenoxy Resin PKHH made by Union Carbide Corporation, molecular weight approximately 30,000).

| Example | Phenoxy Resin (parts per hundred) | Brookfield Viscosity (cps. at 25° C.) |
| --- | --- | --- |
| 6 | 0.75 | 7,500 |
| 7 | 1.50 | 9,000 |
| 8 | 3.0 | 16,000 |

EXAMPLE 9

Letterpress printing plates are made with the photosensitive resin formulation described in Example 1 with 2.3 parts per hundred phenoxy resin dissolved therein. The printing plates are made by doctoring a 40 mil thick layer of resin on a 4 mil polyester backing sheet support, and then exposing the resin through an image-bearing negative transparency to a 3 kilowatt medium pressure mercury arc lamp for two minutes. The uncured photopolymer resin is washed away with an aqueous solution containing 0.1% sodium hydroxide. The resulting plate is dried and cured by exposing it to the 3 kilowatt mercury arc light for an additional two minutes. The resulting printing plate is completely tack-free.

The thus prepared printing plate is mounted on a commercial newspaper printing press and used to print 2000 high quality impressions. Fine lines and half-tone areas are especially sharp and clear.

What I claim and desire to protect by Leters Patent is:

1. In a liquid photosensitive composition consisting essentially of:
   (a) at least one unsaturated polyester produced from at least one unsaturated polycarboxylic acid, a saturated polycarboxylic acid, and at least one polyol;
   (b) at least one ethylenically unsaturated addition polymerizable monomer; and
   (c) at least one photosensitive initiator selected from the group consisting of benzoins, anthraquinones, diketones, 2,2-dialkoxy substituted acetophenones, 2,2-dialkoxy-2-phenyl substituted acetophenones, and disulfides;

the improvement of adding from about 0.1 to about 15%, based on total weight, of a poly(hydroxylether) derived from a diphenol and an epihalohydrin having a molecular weight in the range of from about 8,000 to about 200,000.

2. The composition of claim 1 wherein the said poly(hydroxylether) is a bisphenol A-epichlorohydrin resin.

3. In a process for increasing the viscosity of a liquid photosensitive composition consisting essentially of:
   (a) at least one unsaturated polyester produced from at least one unsaturated polycarboxylic acid, a saturated polycarboxylic acid, and at least one polyol;
   (b) at least one ethylenically unsaturated addition polymerizable monomer; and
   (c) at least one photosensitive initiator selected from the group consisting of benzoins, anthraquinones, diketones, 2,2-dialkoxy substituted acetophenones, 2,2-dialkoxy-2-phenyl substituted acetophenones, and disulfides;

the improvement of dissolving in the said liquid photosensitive composition from about 0.1 to about 15%, based on total weight, of a poly(hydroxylether) derived from a diphenol and an epihalohydrin having a molecular weight in the range of from about 8,000 to about 200,000.

4. The process of claim 3 wherein the said poly(hydroxylether) is a bisphenol A-epichlorohydrin resin.

5. In a photosensitive element comprising a support layer and a liquid photosensitive layer, said liquid photosentitive layer consisting essentially of:
   (a) at least one unsaturated polyester produced from at least one unsaturated polycarboxylic acid, a saturated polycarboxylic acid, and at least one polyol;
   (b) at least one ethylenically unsaturated addition polymerizable monomer; and
   (c) at least one photosensitive initiator selected from the group consisting of benzoins, anthraquinones, diketones, 2,2-dialkoxy substituted acetophenones, 2,2-dialkoxy-2-phenyl substituted acetophenones, and disulfides;

the improvement of adding from about 0.1 to about 15%, based on total weight, of a poly(hydroxylether) derived from a diphenol and an epihalohydrin having a molecular weight in the range of from about 8,000 to about 200,000.

* * * * *